United States Patent
Green

(10) Patent No.: US 8,912,430 B2
(45) Date of Patent: Dec. 16, 2014

(54) SI CELLS WITH III-V MULTIJUNCTION CELLS

(75) Inventor: Martin Andrew Green, Bronte (AU)

(73) Assignee: Newsouth Innovations Pty Limited, Sydney (AU)

( * ) Notice: Subject to any disclaimer, the term of this patent is extended or adjusted under 35 U.S.C. 154(b) by 0 days.

(21) Appl. No.: 13/577,617

(22) PCT Filed: Feb. 11, 2011

(86) PCT No.: PCT/AU2011/000146
§ 371 (c)(1),
(2), (4) Date: Oct. 31, 2012

(87) PCT Pub. No.: WO2011/097682
PCT Pub. Date: Aug. 18, 2011

(65) Prior Publication Data
US 2013/0056045 A1 Mar. 7, 2013

(30) Foreign Application Priority Data
Feb. 12, 2010 (AU) ................. 2010900574

(51) Int. Cl.
*H01L 31/0525* (2014.01)
*H01L 31/052* (2014.01)

(52) U.S. Cl.
CPC .......... *H01L 31/0524* (2013.01); *Y02E 10/52* (2013.01); *H01L 31/0528* (2013.01); *H01L 31/0525* (2013.01)
USPC .............................. 136/257; 136/246; 136/255

(58) Field of Classification Search
CPC .................... H01L 31/0524; H01L 31/024
USPC ............................................ 136/257
See application file for complete search history.

(56) References Cited

U.S. PATENT DOCUMENTS

| 2003/0075212 A1* | 4/2003 | Chen ............................. 136/246 |
| 2005/0051205 A1* | 3/2005 | Mook ............................. 136/255 |
| 2009/0199889 A1 | 8/2009 | Willmott | |
| 2010/0000593 A1* | 1/2010 | Mastromatteo ............... 136/246 |

FOREIGN PATENT DOCUMENTS

| GB | 1 528 527 | 10/1978 |
| WO | WO-2009/032052 A2 | 3/2009 |

OTHER PUBLICATIONS

Richard R. King, "Raising the Efficiency Ceiling in Multijunction Solar Cells", Spectrolab, Inc, (Sep. 2009), Retrieved from the Internet<URL: http://www.spectrolab.com/DataSheets/PV/pv_tech/msce.pdf>, pp. 1-76.*
International Search Report mailed on Jun. 23, 2011, for PCT Patent Application No. PCT/AU2011/000146 filed on Feb. 11, 2011, three pages.
Written Opinion mailed on Jun. 23, 2011, for PCT Patent Application No. PCT/AU2011/000146 filed on Feb. 11, 2011, five pages.

\* cited by examiner

*Primary Examiner* — Jeffrey T Barton
*Assistant Examiner* — Tae-Sik Kang
(74) *Attorney, Agent, or Firm* — Morrison & Foerster LLP

(57) ABSTRACT

A solar conversion assembly comprises: a) a type III-V multiple cell stack solar cell device b) a silicon solar cell device c) a band splitting device located relative to the type III-V solar cell device and the silicon solar cell device. The band splitting device splits light falling on the splitting device into a plurality of wavelength bands and directs a first of said bands to the type III-V solar cell device and the second of said bands to the silicon solar cell device.

24 Claims, 4 Drawing Sheets

US 8,912,430 B2

SI CELLS WITH III-V MULTIJUNCTION CELLS

CROSS REFERENCE TO RELATED APPLICATIONS

This application is a National Phase filing under 35 U.S.C. §371 of International Application PCT/AU2011/000146, with an International Filing Date of Feb. 11, 2011, entitled "SI CELLS WITH III-V MULTIJUNCTION CELLS", which claims the benefit of priority from Australian Patent Application Serial No. 2010900574, with the priority filing date of Feb. 12, 2010, which are hereby incorporated by reference in their entirety and for all purposes as if put forth in full below.

INTRODUCTION

The present invention relates generally to the field of photovoltaics and in particular the invention provides structures for improved thermodynamic cycles for conversion of concentrated solar power.

BACKGROUND

Low conversion efficiency of the traditional thermodynamic cycles has been one factor that has hampered practical application of concentrated solar power. The highest conversion efficiency to date is reported to be 31.3% for a Stirling engine coupled to a 64 m$^2$ (active area) dish on a freezing but very bright day in Albuquerque in January 2008. This was not a particularly large improvement on the previous record of 29.4% set 25 years earlier, suggesting that practical upper limits are being approached. Efficiencies of power tower, parabolic trough and linear Fresnel reflector approaches, generally based on the Rankine thermodynamic cycle, are appreciably lower with peak efficiency of 25%, 20% and 16% respectively the best expected in the near to medium term.

Quantum based thermodynamic cycles offer higher efficiency. In particular, it has been shown that the conversion efficiency for monochromatic light in a photovoltaic converter monotonically approaches 100% as the bandwidth and angular spread of incident light decreases and the intensity increases. The angular spread of sunlight from the sun's disc and the finite intensity of sunlight places a thermodynamic limit of 87% on sunlight conversion based on this strategy of dividing sunlight into monochromatic components. The recent spectacular rise in efficiency of monolithic tandem stacks of solar cells is testimony to this effect. Efficiency has increased spectacularly from 24% in 1990 to the most recent record of 41.6% efficiency established by Boeing/Spectrolab.

In recent times interest has increased in spectral splitting as a means to further enhance the efficiency of solar conversion beyond that possible from monolithic cell stacks. An efficiency of 42.7% measured by partitioning the solar spectrum and converting by 5 separate cells was recently reported earlier this year and more recently this figure has been extended to 43%. Complementing these cell results, a system efficiency of 36.5% has been independently confirmed for a small system based on this approach including additional system losses such as optical losses in the required concentrating lens and dichroic reflectors. This is already appreciably higher than the 31.3% result with traditional thermodynamic cycles, despite the obvious untapped potential.

SUMMARY

The present invention provides a solar conversion assembly comprising:
a) a type III-V multiple cell stack solar cell device
b) a silicon solar cell device
c) a band splitting device located relative to the type III-V solar cell device and the silicon solar cell device to split light falling on the splitting device into a plurality of wavelength bands and directing a first of said bands to the type III-V solar cell device and the second of said bands to the silicon solar cell device.

The band splitting device will preferably split the spectrum about a wavelength in the range of 890-1100 nm.

The solar conversion device is preferably also configured to constrain the angle of incidence of light on the type III-V solar cell device. The angular constraint may be achieved by providing an inlet port having an anti-reflection (AR) coating with a restricted angular response. The bandpass reflector may also have a restricted angular response.

The assembly will preferably comprise receiver sub-assembly containing the solar cell devices and band splitter and a light concentrating device, such as a reflective concentrator or transmissive lens system which concentrates and directs light falling onto the band splitting device in receiver the sub-assembly thereby also limiting the angular range of light rays entering the sub assembly. The degree of constraint will depend upon the disk diameter of the light concentrating system and the distance from the lens to the sub assembly containing the solar cells.

The solar conversion assembly may be modified by employing a band splitting device that is pivotable about a pivot axis to change an angle of incidence of light impinging on the band splitting device. In this case the band splitting device will preferably have a splitting characteristic which varies as the angle of incidence of the light impinging on the band splitting device varies. When the band splitting device is pivotable it may be independent of the semiconductor receivers. Alternatively the band splitting device may be located over a surface of one of the semiconductor receivers, whereby the receiver and band splitting device pivot together, in which case it may be a bandpass filter positioned on the receiving surface of the Silicon receiver.

The band splitting device may be a dichroic filter.

BRIEF DESCRIPTION OF THE DRAWINGS

Embodiments of the invention will now be described with reference to the accompany drawings in which.

DETAILED DESCRIPTION OF EMBODIMENTS

Comparative studies frequently suggest cost advantages for concentrating solar power (CSP) system based on the power tower concept. The potential of the power tower approach with improved efficiency receivers has recently gained interest for those working in the area of concentrating solar power.

Compared to approaches with distributed receivers, the advantage of the power tower concept is that it allows for more sophisticated, potentially higher performance receivers. With the traditional thermodynamic cycles, this allows higher operating temperatures, although these introduce their own challenges in the thermally unstable environment that results. However, more advanced thermodynamic cycles only require high effective temperatures rather than actual temperature with consequent operational advantages.

Embodiments of the invention will harness the benefits of tandem III-V cell with those of silicon cells to achieve otherwise un-attainable efficiencies. These embodiments of the invention make use of spectrum splitting in combination with the power tower concept for higher efficiency conversion of concentrated solar power using a "power-cube" 11, shown schematically in FIG. 1, capable of energy conversion efficiency above 40%, including all optical losses.

Figure 1:
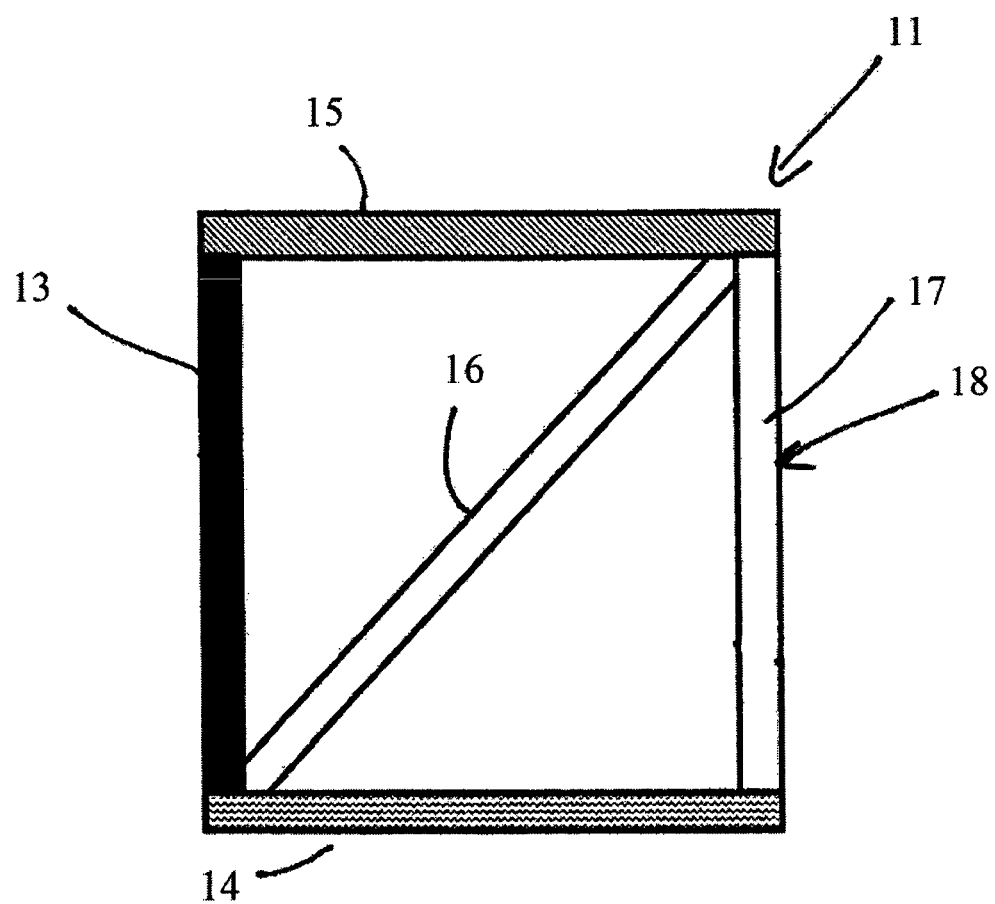
FIG. 1 shows a "Power-cube" receiver design according to an embodiment of the present invention.

The design of the "Power-cube" receiver 11 seen in FIG. 1, includes an inlet port 17, a Type III-V semiconductor receiver 13, a Silicon receiver 14 and a wide-band reflector 15 assembled in a cube with a bandpass (e.g. dichroic) reflector 16 positioned diagonally to separate the incoming light into two bands directed respectively to the Type III-V semiconductor receiver 13 and the Silicon receiver 14. The inlet port 17 is provided with an Anti-reflection coating 18 to enhance the capture of light in the power cube 11. The AR coating 18 is provided with a restricted angular response to limit the angle of incidence of light on the Type III-V semiconductor receiver 13. Light enters the power cube through the inlet port 17 (and the AR coating 18) and strikes the diagonal bandpass reflector 16 which reflects light within the passband frequencies and passes light outside the passband frequencies. The reflected light is redirected to the silicon cell 14 by the bandpass reflector 16 whereas the transmitted light passes to the Type III-V semiconductor receiver 13. Usual antireflection techniques will be used on the receivers 13 & 14 but there will be some stray light reflected from the surfaces of the receivers which will then be reflected from various surfaces inside the cube to different extents and some will be directed back to one of the receivers while some will escape through the inlet port and be lost.

A Solar System III-V receiver which recently achieved efficiencies above 40% for individual cells could conveniently form the Type III-V receiver 13 of FIG. 1.

Figure 2:
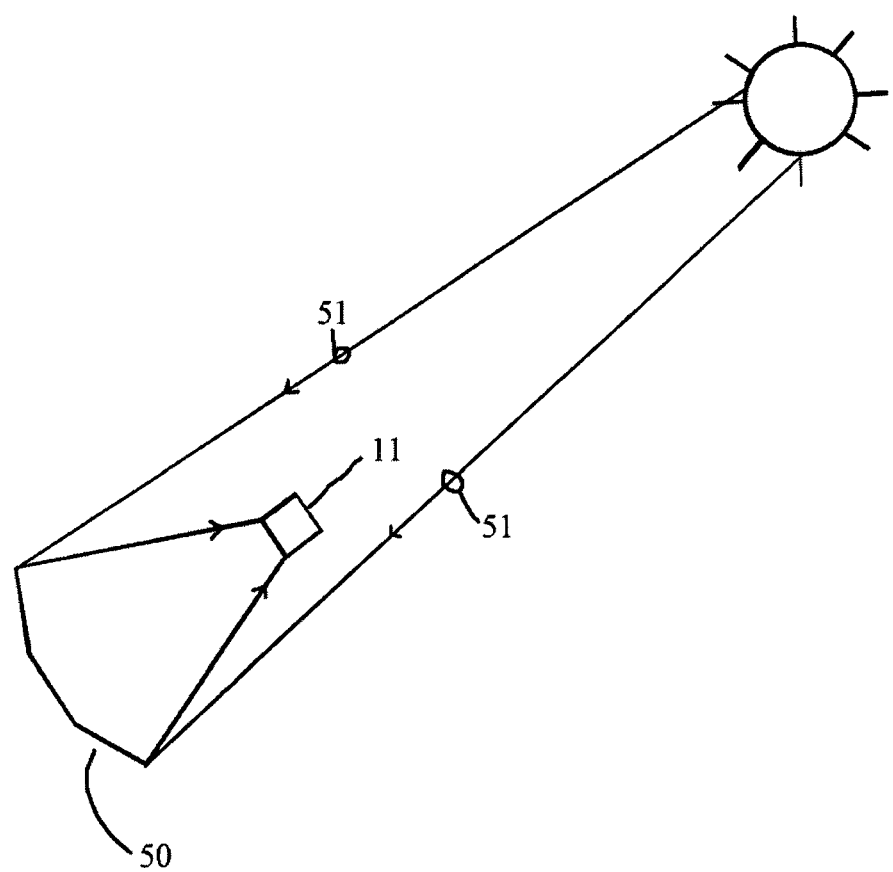
FIG. 2 schematically illustrates a reflective concentrator and power cube according to an embodiment of the invention.

The power tower concept offers the potential for careful optimisation of the receiver to give maximum efficiency. Referring to FIG. 2, this approach employs a reflector system 50 to concentrate solar energy 51 onto the inlet port 17 of the power cube 11. The power cube 11 achieves higher performance by complementing the III-V cell stack by the additional incorporation of much lower cost silicon cells that can increase performance by up to 6% absolute, and by constraining the system's angular response to improve the voltage of the III-V cells.

A recent Boeing/Spectrolab 40.7% efficient 3-cell stack is described in the proceedings of the 51st Electronic Materials Conference, June, 2009 (Richard King) in which the I-V curve and device configuration of the Boeing/Spectrolab device are described and in which the final output curve of this device is shown, together with that of the composite cells. Such a device would also be suitable for use in the present power cube design. In the power cube design a surplus 0.085 A/W of the Ge cell (subcell 3) is deflected to a Si cell and converted at over 0.7V, which is typical of operation at high concentration, with a resulting combined efficiency boosted by at least 6% giving a finial value above 46%. This boost offsets losses at the system level allowing a big-boost in the performance of a practical solar converter to values above 40%. The dielectric-based bandpass reflector in FIG. 1 is designed to reflect wavelengths in the circa 890-1100 nm range to the silicon array shown.

The proceedings of the 51st Electronic Materials Conference, June, 2009 (Richard King) also graphically illustrates radiative efficiencies of III-V cells fabricated by Boeing/Spectrolab, deduced from voltage. As shown in these radiative efficiency curves (lower red lines), some III-V cells have radiative efficiencies approaching 100%. Those within 60 mV of the lower dashed red line have radiative efficiency above 10%. Such cells will see a voltage improvement if their angular emission of light is restricted. This can be achieved by restricting the range of angles to which the cells respond. In the "power-cube", this is easily achieved by restricting the angular response of the AR coating of the inlet port 17 and/or of the bandpass reflector 16. Since the heliostat field directs light to the tower over a limited solid angle, reasonable gains can be expected as cell technology continues to mature. Restricting the angular acceptance angle to half would increase voltage/cell by 2-20 mV for radiative efficiencies above 10%.

Figure 3:
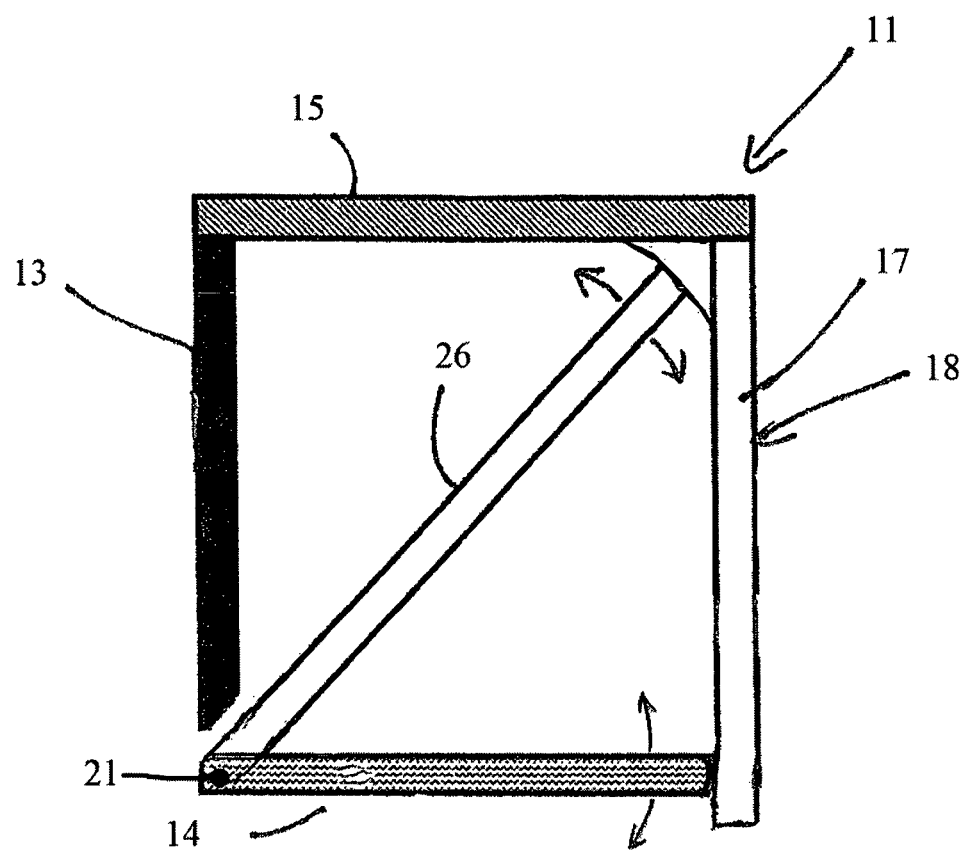
FIG. 3 shows a "Power-cube" receiver design similar to that of FIG. 1 in which the bandpass reflector is pivotable.

The embodiment of FIG. 1 is not optimal because the cells in the stack of cells which make up the Type III-V semiconductor receiver will be connected in series, as the spectral content of the sunlight entering the cube varies during the day, the mismatch of currents generated by the cells in the Type III-V semiconductor receiver will change causing a variable loss. Referring to FIG. 3 an improved "Power-cube" receiver has a bandpass (e.g. dichroic) reflector 26 positioned diagonally to separate the incoming light into two bands directed respectively to the Type III-V semiconductor receiver 13 and the Silicon receiver 14 with the bandpass (e.g. dichroic) reflector 26 and the Silicon receiver 14 each pivotable about a pivot axis 21. By controlling the angle of incidence of the light impinging on the reflector as the spectral content of the light changes, the reflection/transmission properties of the bandpass reflector are shifted in a manner that compensates for the variable spectral content of the light during the day. This will decrease the spectral mismatch in the Type III-V cells and allow the maximum amount of light to be sent to the silicon cell increasing overall energy conversion efficiency over the day.

Otherwise the "Power-cube" receiver of FIG. 3 is similar to that of FIG. 1 and may be used in the system of FIG. 2.

In another variation of the conversion assembly of FIGS. 1 and 3, the "freestanding" reflector 16, 26 can be replaced with a reflector 116 attached to the surface of one of the semiconductor receivers, in this case the silicon receiver 114. The design of the converter 111 seen in FIG. 4, includes an inlet port 117, a Type III-V semiconductor receiver 113, a Silicon receiver 114 and a bandpass (dichroic) filter 116 positioned on the receiving surface of the Silicon receiver 114 and at an acute angle to the Type III-V semiconductor receiver 113. The AR coating 18 is provided with a restricted angular response to limit the angle of incidence of light on the Type III-V semiconductor receiver 113. Light enters the converter 111 through the inlet port 117 (and the AR coating 118) and strikes the diagonal bandpass filter/reflector 116 which passes light within the passband and reflects light outside the passband frequency. The transmitted light is passed to the silicon receiver 114 by the bandpass filter/reflector 116 whereas the reflected light is redirected to the Type III-V semiconductor receiver 113. Alternatively the positions of the silicon receiver 114 and Type III-V semiconductor receiver 113, in which case the transmission/reflection characteristic of the filter/reflector 116 must be inverted. Usual antireflection techniques will be used on the receivers 113 & 114, but there will be some stray light reflected from the surfaces of the receivers which will then be reflected from various surfaces inside the converter to different extents and some will be directed back to one of the receivers while some will escape through the 117 inlet port and be lost.

Figure 4:
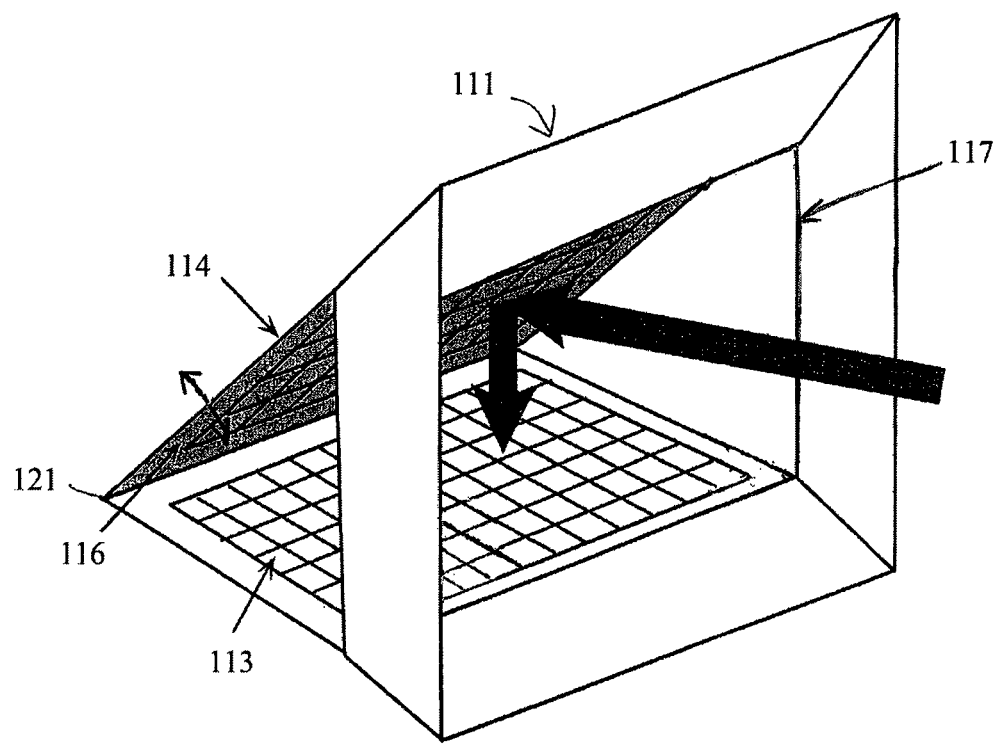
FIG. 4 shows a variation on the design of FIG. 3 in which a band pass filter/reflector is located over a surface of a semiconductor receiver and the respective semiconductor receiver is pivotable with the bandpass filter/reflector.

Other than the configuration of the reflector over one receiver, the FIG. 4 converter is functionally is similar to that of FIG. 3 and may be used in the system of FIG. 2. While described with a bandpass filter 116 positioned over the silicon receiver 114, a bandpass reflector could equally be positioned over the Type III-V semiconductor receiver 113 and this pair pivoted together.

It will be appreciated by persons skilled in the art that numerous variations and/or modifications may be made to the invention as shown in the specific embodiments without departing from the scope of the invention as broadly described. The present embodiments are, therefore, to be considered in all respects as illustrative and not restrictive.

The invention claimed is:

1. A solar conversion assembly comprising:
   a) a type III-V multiple cell stack solar cell device, the type III-V multiple cell stack solar cell device comprising a germanium solar cell device and having a first light receiving surface extending in a first plane;
   b) a silicon solar cell device located separately from the type III-V multiple cell stack solar cell device, the silicon solar cell device having a second light receiving surface extending in a second plane different from the first plane, wherein the first and second planes intersect;
   c) a planar band splitting device located relative to the type III-V multiple cell stack solar cell device and the silicon solar cell device to split light falling on the planar band splitting device into a first light component and a second light component, the first light component having only a first wavelength band and the second light component having a plurality of wavelength bands having wavelengths that are less than and greater than the first wavelength band, wherein the planar band splitting device is located between the first light receiving surface and the second light receiving surface such as to direct the first light component to the second light receiving surface of the silicon solar cell device and direct the second light component to the first light receiving surface of the type III-V multiple cell stack solar cell device.

2. The solar conversion assembly of claim 1 wherein the band splitting device splits the light such that the first wavelength band comprises wavelengths in the range of 890-1100 nm.

3. The solar conversion assembly as claimed in claim 1 wherein band splitting device is a bandpass reflector which reflects wavelengths within passband frequencies and transmits wavelengths outside the passband frequencies or a bandpass filter which transmits wavelengths within passband frequencies and reflects wavelengths outside the passband frequencies.

4. The solar conversion assembly of claim 1 wherein an angular response constraining device is located relative to the type III-V multiple cell stack solar cell device to constrain an angle of incidence of light on the type III-V multiple cell stack solar cell device.

5. The solar conversion assembly of claim 4 wherein the angular response constraining device is an inlet port having an anti-reflection (AR) coating with a restricted angular response.

6. The solar conversion assembly of claim 5 wherein the band splitting device has a restricted angular response to light.

7. The solar conversion assembly of claim 6 further comprising a broadband reflector located relative to the band splitting device and the type III-V multiple cell stack solar cell device.

8. The solar conversion assembly of claim 6 comprising
   a) a receiver sub-assembly containing
      i) the type III-V multiple cell stack solar cell device;
      ii) the silicon solar cell device
      iii) the band splitting device and
   b) a light concentrating device which directs solar radiation at the inlet port.

9. The solar conversion assembly of claim 8 wherein the light concentrating device comprises a reflective concentrator which concentrates and directs light falling onto the band splitting device in the receiver sub-assembly to thereby limit an angular range of light rays entering the receiver sub-assembly.

10. The solar conversion assembly of claim 8 wherein the light concentrating device comprises a transmissive lens system which concentrates and directs light falling onto the band splitting device in the receiver sub-assembly thereby limiting an angular range of light rays entering the receiver sub-assembly.

11. The solar conversion assembly of claim 8 wherein a splitting characteristic of the band splitting device is dependent upon an angle of incidence of light impinging on the band splitting device.

12. The solar conversion assembly as claimed in claim 1 wherein the band splitting device is pivotable relative the type III-V multiple cell stack solar cell device and/or the silicon solar cell device about a pivot axis to change an angle of incidence of light impinging on the band splitting device.

13. The solar conversion assembly as claimed in claim 12 wherein the band splitting device is located on the first light receiving surface of the silicon solar cell device, whereby the first light receiving surface of the silicon solar cell device and band splitting device pivot together about a pivot axis to change an angle of incidence of light impinging on the band splitting device and wherein the band splitting device is a bandpass filter which transmits wavelengths within passband frequencies and reflects wavelengths outside the passband frequencies.

14. The solar conversion assembly as claimed in claim 12 wherein the band splitting device is positioned on the first light receiving surface of the type III-V multiple cell stack solar cell device, whereby the first light receiving surface of the type III-V multiple cell stack solar cell device and band splitting device pivot together about a pivot axis to change an angle of incidence of light impinging on the band splitting device and wherein the band splitting device is a bandpass reflector which reflects wavelengths within passband frequencies and transmits wavelengths outside the passband frequencies.

15. The solar conversion assembly as claimed in claim 12, wherein the band splitting device is positioned on the second light receiving surface of the silicon solar cell device, whereby the second light receiving surface of the silicon solar cell device and the band splitting device pivot together about the pivot axis to change the angle of incidence of light impinging on the band splitting device and wherein the band splitting device is a bandpass filter which transmits wavelengths within passband frequencies and reflects wavelengths outside the passband frequencies.

16. The solar conversion assembly as claimed in claim 1 wherein the band splitting device is located on one of the first light receiving surface of the type III-V multiple cell stack solar cell device and the second light receiving surface of the silicon solar cell device.

17. The solar conversion assembly as claimed in claim 16 wherein the band splitting device is positioned on the first light receiving surface of the type III-V multiple cell stack solar cell device and wherein band splitting device is a bandpass reflector which reflects wavelengths within passband frequencies and transmits wavelengths outside the passband frequencies.

18. The solar conversion assembly as claimed in claim 16, wherein the band splitting device is positioned on the second light receiving surface of the silicon solar cell device and wherein band splitting device is a bandpass filter which transmits wavelengths within passband frequencies and reflects wavelengths outside the passband frequencies.

19. The solar conversion assembly as claimed in claim 16 wherein the band splitting device is positioned on the second light receiving surface of the silicon solar cell device.

20. The solar conversion assembly as claimed in claim 19 wherein band splitting device is a bandpass filter which transmits wavelengths within passband frequencies and reflects wavelengths outside the passband frequencies.

21. The solar conversion assembly of claim 1, wherein the solar conversion assembly comprises a cube, and wherein the type III-V multiple cell stack solar cell device is comprised in a first wall of the cube and the silicon solar cell device is comprised in a second wall of the cube.

22. The solar conversion assembly of claim 21, wherein the band splitting device is located along a diagonal plane relative to the first and second walls.

23. The solar conversion assembly of claim 21, further comprising a light inlet port, wherein the light inlet port is comprised in a third wall of the cube.

24. The solar conversion assembly of claim 23, comprising a broadband reflector, wherein the broadband reflector is comprised in a fourth wall of the cube.

* * * * *